United States Patent [19]

Levinos

[11] 3,909,255

[45] Sept. 30, 1975

[54] ELECTROLYTICALLY INDUCED POLYMERIZATION UTILIZING ZINC AND ALKALI METAL SULFITE

[75] Inventor: Steven Levinos, Summit, N.J.

[73] Assignee: Keuffel & Esser Company, Morristown, N.J.

[22] Filed: Dec. 3, 1973

[21] Appl. No.: 421,294

[52] U.S. Cl. .................. 96/1 E; 96/35.1; 96/115 P; 204/18 PC; 204/159.18; 204/159.24

[51] Int. Cl.² ..................... G03G 13/22; G05C 5/00

[58] Field of Search .... 96/115 P, 1 E; 204/2, 18 PC

[56] References Cited

UNITED STATES PATENTS

| | | | |
|---|---|---|---|
| 3,236,644 | 2/1966 | Gilman, Jr. et al. | 96/116 P |
| 3,285,837 | 11/1966 | Neher | 206/18 PC |
| 3,436,215 | 4/1969 | Levinos et al. | 96/115 P |
| 3,464,960 | 9/1969 | Sobreski et al. | 260/80.3 R |
| 3,600,173 | 8/1971 | Pevims | 96/115 P |
| 3,697,275 | 10/1972 | Hazakawa et al. | 96/115 P |

*Primary Examiner*—Roland E. Martin, Jr.
*Assistant Examiner*—J. P. Brammer
*Attorney, Agent, or Firm*—Lionel N. White, Esq.

[57] ABSTRACT

Material useful in electropolymerization processes comprises a conductive zinc-containing support and a layer thereon of a composition comprising a polymerizable monomer and an alkali metal sulfite. Electrolysis of the composition results in the formation of zinc sulfite with subsequent electrolytic generation of polymerization-inducing free radicals. The anodic reaction ensures polymerization at and bonding of the resulting polymer to the support sheet of the material even when used in conjunction with zinc oxide photoconductor cathode layers. The material is particularly useful in negative-working imagery and in the preparation of patterned resist layers.

4 Claims, No Drawings

ELECTROLYTICALLY INDUCED POLYMERIZATION UTILIZING ZINC AND ALKALI METAL SULFITE

BACKGROUND OF INVENTION

Photoconductive layers have long been employed as a means for obtaining from a limited light exposure an image-wise pattern of conductivity which can be utilized in a number of electrolytic processes for generating visible, high-contrast, substantially permanent graphic images. Photoconductive layers have thus been employed, for example, in imaging methods which entail the electrolytic reaction of color formers to provide a visible image, as described in U.S. Pat. No. 2,764,693. As a means for providing the definitive image pattern of electrical conductivity, photoconductive layers have also been employed in electropolymerization methods as described in U.S. Pat. No. 3,600,173.

The present invention also involves electropolymerization of ethylenically unsaturated compounds, such as vinyl monomers, and in this respect is sufficiently closely related to the subject matter of the latter referenced patent that the disclosures and discussions there, particularly with respect to polymerizable monomers and photoconductive materials per se, will provide a significant and substantial description of the use of these materials in the present invention.

An invention described in U.S. Pat. No. 3,464,960 provides a means for effecting electrolytically the polymerization of vinyl materials through the use of soluble zinc salts. As there described the system utilizes the electrolysis of a composition of vinyl monomers containing a dissolved zinc salt to generate polymerization-inducing free radicals. The use of such a system for obtaining images comprising polymerized vinyl materials has several notable disadvantages, however. Any useful compositions, for example, require that the selected zinc salts be retained in solution and are, as a result, seriously limited in useful shelf life. Further, the criticality of the maintenance of a highly acid pH in the composition and the inherent plating out of zinc with the formation of polymeric material render the system of little practical utility, particularly where the formation of patterned resist layers is desired.

An additional drawback, and one of substantial significance in imaging systems, results from the fact that the electropolymerization procedures utilizing dissolved zinc salts involves a reaction which is cathodic by nature, as described in the referenced disclosure. This characteristic coupled with the inherent rectification properties of generally preferred photoconductor materials—zinc oxide, for example—results in the formation of polymer images at the interfact between the photoconductor and the polymerizable composition of the imaging material.

While such a disposition of products of electrolysis at the photoconductor surface is not detrimental, and may even be preferable in the direct-imaging systems earlier noted and those additionally described, for example, in U.S. Pat. No. 3,010,883, the polymerization of monomeric ingredients at the surface more disposed from the carrier sheet of an imaging composition is far from advantageous. This result derives from the fact that polymerizable imaging compositions are employed, for the most part, in wash-off procedures where the polymerized matrix must be closely adhered to the support of the material while the unexposed and, thus, non-polymerized materials are removed from the carrier sheet by washing or the like.

SUMMARY

As noted in U.S. Pat. No. 3,464,960, the generation of polymerization-initiating catalyst species, presumably in the form of free radical entities, through electrolysis of a composition containing dissolved zinc salts is primarily cathodic in nature. As a result, utilization of such a system for the formation of insoluble polymer products at the interface between a polymerizable composition layer and its support sheet, as is generally preferred in the imaging of products which are developed by wash-off removal of unpolymerized material, requires the formation of an electrolytic circuit wherein the conductive support sheet comprises the cathode. While such an arrangement may be readily prepared through the use of cadmium sulfide photoconductor layers, the more commonly available and widely utilized zinc oxide photoconductors find little practical utilization in these methods.

Due to the inherent rectification properties of zinc oxide photoconductor materials, it is not practical to utilize these compounds as the anode in electrolytic circuits, since the flow of current in such a circuit would be severely restricted. The present invention, however, provides a system of photoelectropolymerization which can utilize the desirable zinc oxide photoconductors in their most effective cathodic roles, yet can achieve polymerization at a support surface by providing an anodic polymerization reaction.

In accordance with the present invention, a conductive zinc or zinc-containing support is coated with a layer of a composition comprising a polymerizable vinyl monomer and an alkali metal sulfite. Combining the resulting sheet material in the usual manner with a zinc oxide photoconductor layer on a substantially transparent conductive support, and a source of electric current, yields a system of potential electrolysis which can be activated by exposure of the photoconductor to light, usually in the form of the image to be reproduced.

As the result of illumination, and thus the completion of the electrical circuit in the system, electrolysis of the imaging sheet composition causes the generation of zinc ions at the carrier anode with formation of zinc sulfite in the immediate vicinity of the anode and a resulting initiation of polymerization in that region of the composition. Contrary to the procedures described in U.S. Pat. No. 3,464,960, the initial lack of zinc ions throughout the composition mass renders an acidic environment in the polymerizable material unnecessary, yet the noted reaction at the acid electrode, i.e., the anode, provides the desirable acid conditions during the period of actual polymer formation. Thus, the polymerizable material may be maintained in a more storage-stable neutral pH condition.

Since the formation of zinc ions is restricted to the immediate region of the carrier anode of the system, the formation of polymerization-initiating free radicals, and the resulting polymerization of the vinyl monomer, is concentrated at the interface between the imaging composition and its carrier sheet. Thus, from the very outset of polymerization there is formed the bond between the polymerized monomer and the carrier sheet which is so important in the formation and retention of images which rely for their development upon the removal of unpolymerized monomer composition. Permanently legible images and effective resist patterns may be generated in this manner with a minimum amount of polymerization and in a substantially shorter time with the materials and systems of the present invention. The anodic generation of polymer resulting from the use of the present materials eliminates the previous less desirable alternatives of polymerizing through the whole thickness of an imaging composition layer when using zinc oxide photoconductors and their required cathodic polymerization systems, or utilizing the more costly non-rectifying photoconductor layers. Further, the anodic character of the polymerization ensures against the deleterious plating out of zinc metal in the polymeric products.

DESCRIPTION

Polymerizable compounds, photoconductor materials, binder resins, coating procedures, and the like described in the above-mentioned art references may likewise generally be used in the present invention. The numerous polymerizable vinyl compounds and monomers suggested there and elsewhere in the art, as well as the many noted cross-linking agents, may be similarly employed in the preparation of the present polymerizable compositions. It should be noted, however, that acidic monomers such as acrylic and methacrylic acids are less desired in materials destined for extended storage due to their tendency to cause the formation of soluble zinc salts in the region of the zinc-containing anode. In general, any vinyl monomers which do not thus effect the anode are preferred and may be suitably applied throughout the range of useful systems. Of particular utility are the numerous water-soluble monomer materials such as acrylamide, N-methylol acrylamide, diacetone acrylamide, hydroxyethyl methacrylate, methacrylamide, N-vinyl pyrrolidone, and the acrylates of barium, calcium, strontium, and magnesium. The addition of difunctional cross-linking agents such as N,N'-methylenebisacrylamide in amounts from about 2 to 10 percent by weight of monomer is also advantageous, as in prior systems.

Coating adjuncts may be employed as desired. For example, natural or synthetic film formers such as gelatin, polyvinyl alcohol, carboxymethyl cellulose, and the like are useful in the present compositions. The use of such binders serves the usual purpose of maintaining homogeniety in the coating, with gelatin, in particular, providing an additional advantage by virtue of its capability of becoming involved in the formation of graft polymer and thus extending the resulting polymerization product.

These materials exhibit also a pronounced effect upon the amount of monomer materials which may be incorporated into the polymerizable composition without a resulting crystallization of the monomer from the composition. Thus, the proportion of monomer in a polymerizable layer is limited only by compatibility tolerance with respect to additional materials in the composition and is in no way critical to the substance of the present invention. Blends of solid monomer with gelatin binder adjuncts have been found to be suitable with up to about 35% monomer content. Greater amounts of liquid monomers such as N-vinyl pyrrolidone may, of course, be employed.

The addition of glycerin, ethylene glycol, or other humectant is very desirable for moisture retention, which is beneficial in maintaining current sensitivity in coated layers. Such humectants, likewise, have no adverse effect on the long term stability of the coating composition.

Other components of the present systems which are common to electropolymerization systems, for example, conductive cathode elements which are preformed to effect selected patterns of polymeric material as well as photoactive cathodes comprising photoconductor layers on substantially transparent conductive bases, may be any of the many types previously suggested. A particularly suitable cathode for use in photoimaging applications of this invention is one prepared by forming a layer of dye-sensitized zinc oxide in a matrix of hardened epoxy resin on the conductive surface of a commercially available electrically-conductive glass panel having a resistivity of about 70 ohms/sq. The layer is comprised of about one part of binder to 5 parts of zinc oxide sensitized with about 0.1 percent of a mixture of fluorescein, rose bengal, and bromphenol blue. To provide a practical measure of chemical and abrasion resistance, the photoconductive coating is over-coated with a conductive layer comprising one part of carbon black and about three parts of hardened epoxy resin matrix.

It will thus be apparent that the substance of the present invention resides in the utilization of a composition of a polymerizable ethylenically unsaturated compound with an alkalai metal sulfite, such as sodium sulfite, in an electrolytic system with an anode which comprises a metallic zinc component in contact with the composition. The anode of the system may thus be a zinc strip or sheet, or a support element of other metal or electrically conductive material bearing a plating of zinc or a coating of a conductive composition comprising a substantial metallic zinc content. Electrolyzation of the composition results in the formation of polymeric material, as earlier described, with the disposition of such formation upon the anode being controllable, particularly in coated compositions, in accordance with selected patterns of electrical conductivity in the system, such as through the use of a light-imaged photoconductive cathode, the application of a cathode to various surface areas of the layer, or the use of a cathode of predetermined shape.

PREFERRED EMBODIMENTS

The present invention may be applied to the formation of polymeric material from a fluid mass of composition with deposition upon the whole of an anode surface or the system may be used, as noted, in the preparation of imaged layers on precoated support sheets. Such electropolymerizable sheet materials are preferably prepared from homogeneous compositions coated on a zinc-containing conductive substrate. This use of molecular or colloidal solutions ensures the desirable uniform distribution of components throughout the polymerizable mass.

Aqueous coating vehicles are preferred due to economy and general lack of hazard. The availability of numerous types and classes of water-soluble or water-dispersable monomers, binders, and adjuncts renders this preference additionally practical. Other less water-soluble compounds may be included in compositions through the use of water-miscible solvents such as acetone, alcohols and the like. In the latter practice, common coating art precautions are, of course, observed in order to avoid precipitation or coagulation of components.

The following examples illustrate the present invention and are representative of the procedures employed in preparing the electropolymerizable materials of the invention and the manner of using such materials.

EXAMPLE I

A mixture of the following composition was prepared:

| | |
|---|---|
| Deionized water | 60 ml. |
| Acrylamide | 90 gms. |
| N,N'-methylenebisacrylamide | 5 gms. |

To 25 ml. of this solution were added 5 ml. of a 10 percent aqueous solution of sodium sulfite. The pH of the mixture was 12.3. It was adjusted with dilute sulfuric acid to a pH value of 7.2. This solution was then electrolyzed for 30 seconds between a platinum cathode and a freshly cleaned strip of zinc as the anode. The electrodes were spaced approximately 1 cm apart and the potential of 10 volts D.C. was applied for 30 seconds. A thin layer of polymer formed on the zinc anode and was readily stained by a one percent aqueous solution of methylene blue. The platinum cathode was devoid of polymer.

EXAMPLE II

The following formulation was prepared:

| | |
|---|---|
| Deionized water | 100 ml. |
| Gelatin (inert, high bloom) | 4.5 gms. |
| Sodium dodecyl benzene sulfonate (20% sol.) | 5 ml. |
| Polyvinyl pyrrolidone | 0.8 gms. |
| Sodium sulfite (anhydrous) | 1.0 gms. |
| Acrylamide | 2.1 gms. |
| N,N'-methylenebisacrylamide | 0.4 gms. |
| Glycerin | 2.5 gms. |

Each of the ingredients was added to the deionized water in the order given, with stirring to effect complete dissolution of all the solid components. The pH of this mixture was 11.5 and it was adjusted with dilute sulfuric acid to a value of 7.0. A 25 ml. portion of the mixture was then electrolyzed for 30 seconds between a platinum cathode and a freshly cleaned strip of zinc as the anode. The electrodes were spaced approximately 1 cm. apart and the applied potential was 6 volts D.C. Polymeric material formed on the surface of the zinc anode; yet there was no evidence of any polymer on the surface of the platinum electrode. The copolymer was rendered visible by staining with aqueous methylene blue as in Example I.

EXAMPLE III

The composition of Example II was coated at a wet thickness of about 150$\mu$m on a clean sheet of zinc metal. The coating was then allowed to air dry. A metal linotype printing slug was placed on the coating and was connected to the negative terminal of a D.C. power supply. The zinc sheet was made the anode of the system by connecting it to the positive terminal of the power supply. A potential of 20 volts was applied between the two electrodes for a period of 15 seconds. Non-electrolyzed areas of the coating were then removed by washing with water at a temperature of about 30°C. Polymerized areas were then rendered visible by staining with a 1 percent aqueous solution of methylene blue. A short water rinse was used to remove remnant dye solution from the surface of the plate and provide a vivid image upon the zinc sheet.

EXAMPLE IV

The coated side of a sheet prepared in the manner disclosed in Example III was placed in intimate contact with the carbon coating of a dye-sensitized zinc oxide photoconductive plate such as earlier described. With the zinc carrier of the imaging sheet as anode and the conductive surface of the glass panel as cathode, these two elements were arranged in electrical circuit with a 75-volt DC potential. The glass plate panel of this assembly was then exposed to a projected 15X negative image (500-watt tungsten lamp source) for a period of about 5 seconds. The coated zinc sheet was then removed from the assembly and the coating was washed in clear, warm water for about 1 minute during which time portions of the coating corresponding to the unexposed areas of the photoconductor layer were removed from the carrier sheet. There thus remained, upon the carrier, a good quality, enlarged polymeric positive image of the original negative.

What is claimed is:

1. A method of forming a polymeric image of a polymerizable ethylenically unsaturated compound which comprises:
   a. combining said compound in a composition comprising an alkali metal sulfite;
   b. disposing said composition as a layer upon an electrically conductive body comprising metallic zinc; and
   c. in an electrolytic circuit wherein said conductive body comprises the anode, subjecting said composition layer to the passage of an electrical current in accordance with a pattern corresponding to the image to be formed.

2. A method according to claim 1 wherein said anode is substantially uniformly electrically conductive over the whole of its surface and the cathode of said circuit is in substantial electrically conductive contact with a preselected portion only of the exposed surface of said layer, said portion constituting said image pattern.

3. A method of forming an image which comprises:
   a. providing imaging material comprising an electrically conductive support comprising metallic zinc having a coating thereon of a layer of polymerizable composition comprising:
      1. a polymerizable ethylenically unsaturated compound, and
      2. an alkali metal sulfite;
   b. contacting the exposed surface of said layer with a cathode exhibiting a pattern of electrical conductivity corresponding to the image to be formed;
   c. arranging a source of electrical potential in circuit with said cathode and said electrically conductive support, said support constituting the anode of the arrangement;
   d. causing electrical current to flow through said layer in accordance with the image pattern of conductivity of said cathode, thereby effecting imagewise generation of polymerization-inducing species in said composition layer with concurrent polymerization of said polymerizable compound;

e. separating said cathode from said composition layer; and f. removing unpolymerized composition from said layer.

4. An imaging method according to claim 3 wherein said cathode comprises a layer of a photoconductor compound and said image pattern of electrical conductivity is formed in said cathode by an imagewise light exposure of said photoconductor layer.

* * * * *